United States Patent [19]

Kotaki

[11] Patent Number: 4,987,091
[45] Date of Patent: Jan. 22, 1991

[54] PROCESS OF FABRICATING DYNAMIC RANDOM ACCESS MEMORY CELL

[75] Inventor: Hiroshi Kotaki, Tokyo, Japan

[73] Assignee: NEC Corporation, Tokyo, Japan

[21] Appl. No.: 468,212

[22] Filed: Jan. 22, 1990

[30] Foreign Application Priority Data

Jan. 23, 1989 [JP] Japan .................................. 1-13617

[51] Int. Cl.⁵ .......................................... H01L 21/70
[52] U.S. Cl. .......................................... 437/52; 437/47; 437/60; 437/228; 437/235; 437/918; 437/981; 357/23.6
[58] Field of Search ...................... 437/47, 52, 60, 918, 437/228, 235, 981; 357/23.1; 156/643

[56] References Cited

U.S. PATENT DOCUMENTS

| | | | |
|---|---|---|---|
| 4,112,575 | 9/1978 | Fu et al. | 437/52 |
| 4,164,751 | 8/1979 | Tasch, Jr. | 437/52 |
| 4,350,536 | 9/1982 | Nakano et al. | 357/236 |
| 4,409,722 | 10/1983 | Dockerty et al. | 437/52 |
| 4,711,699 | 12/1987 | Amano | 437/228 |
| 4,918,503 | 4/1990 | Okuyama | 437/52 |

FOREIGN PATENT DOCUMENTS 0012767  1/1980  Japan .
0124533  5/1988  Japan .

Primary Examiner—Brian E. Hearn
Assistant Examiner—T. Thomas
Attorney, Agent, or Firm—Burns, Doane, Swecker & Mathis

[57] ABSTRACT

For making an inter-level insulating film between a capacitor electrode and a gate electrode mild at the shoulder portion thereof, a doped polysilicon film is overlain by a silicon oxide film on a dielectric film structure, and the silicon oxide film is slightly etched through an isotropical technique by using a mask layer for forming a hollow space with a generally quarter-circle configuration beneath the mask layer, then anisotropically etching the silicon oxide and the doped polysilicon by using the same mask layer, then depositing silicon oxide on the entire surface, then exposing the surface of a semiconductor substrate by using an etch-back technique for leaving the inter-level insulating film on the capacitor electrode, then forming a gate electrode on the inter-level insulating film. Since a declining shoulder portion takes place at the upper end of the silicon oxide film due to the isotropical etching, the inter-level insulating film and, accordingly, the gate electrode smoothly extend over the capacitor electrode, and, for this reason, the gate electrode is free from undesirable disconnection.

19 Claims, 9 Drawing Sheets

PROCESS OF FABRICATING DYNAMIC RANDOM ACCESS MEMORY CELL

FIELD OF THE INVENTION

This invention relates to a semiconductor memory device and, more particularly, to a process of fabricating a dynamic random access memory cell of one-transistor and one-capacitor type.

DESCRIPTION OF THE RELATED ART

A typical example of a process of fabricating a random access memory cell is shown in FIGS. 1A and 1B of the drawings. The process starts with preparation of a p-type silicon substrate 1, and a thick field oxide film (not shown) is grown on the major surface of the silicon substrate 1 so that an active device area is defined by the thick field oxide film. A part of the silicon substrate 1 is heavily doped with n-type impurity atoms, and a lower electrode of a storage capacitor is formed in a part of the heavily doped n-type impurity region 11 thus produced, however, the end section (left side in FIG. 1) of the n-type impurity region 11 is used as one of the source and drain regions of a switching transistor (which is hereinafter simply referred to as "drain"). On the active device area is formed a thin insulating film structure 2 which will provide a dielectric film of the storage capacitor at the later stage. The thin insulating film structure 2 is of a multi-film structure consisting of a lower thin silicon oxide film attached to the substrate 1, a silicon nitride film deposited on the lower thin silicon oxide film and an upper thin silicon oxide film formed on the silicon nitride film. On the entire surface of the thin insulating film structure 2 is deposited a polysilicon which is etched and patterned for formation of an upper capacitor electrode 3 of the storage capacitor. The upper capacitor electrode 3 of the polysilicon is oxidized so that a silicon oxide is produced on the surface thereof. The silicon oxide film thus produced provides an inter-level insulating layer 4.

The thin insulating film structure 2 is, then, partially removed until a fresh surface of the substrate 1 is exposed, and the thin insulating film structure 2 including the silicon nitride film and left beneath the capacitor electrode 3 serves as that dielectric film 2 of the storage capacitor (which is also formed in the multi-film structure of $SiO_2/Si_3N_4/SiO_2$). After exposing the fresh surface of the silicon substrate 1, a gate silicon oxide film 5 of the switching transistor is thermally grown on the exposed surface of the silicon substrate 1, and a polysilicon film 6 is deposited over the entire surface as shown in FIG. 1A.

The polysilicon film 6 is etched and patterned to form a gate electrode 7 of the switching transistor, and n-type impurity atoms are doped into the silicon substrate 1 by using the gate electrode 7 as a mask. The n-type impurity region 8 thus formed serves as the other of the source and drain regions of the switching transistor contiguous to a bit line, and an upper insulating oxide 9 is deposited on the entire surface of the structure as shown in FIG. 1B.

The gate electrode 7 shown in FIG. 1B is partially overlapped with the capacitor electrode 3, however, the gate electrode may be spaced from the capacitor electrode without any overlapping in another implementation. As shown in FIG. 1B, a sharp step is inevitably formed at the side 12 of the inter-level insulating layer 4; more particularly, when the dielectric film 2 includes a silicon nitride film, an eaves-like shape 13 is formed at the foot of the side 12 of the insulating layer 4 because a lower portion of a side of the polysilicon electrode 7 attached to and near the dielectric film 2 is oxidized slower than other surface portions including an upper portion of the side of the electrode 7 during the oxidation process.

If the gate electrode 7 is partially overlapped with the capacitor electrode 3 as the structure shown in FIG. 1B, a problem is encountered in that the polysilicon film 6 is much liable to break at the foot of the inter-level insulating layer 4 encircled by a broken line 10 of FIG. 1B because of the sharp step and the eaves-like shape of the side of the inter-level insulating layer 4. Moreover, the gate electrode 7 partially overlapped forms a parasitic capacitor together with the dielectric film 2 and the n+ type impurity region 11 consisting of the drain of the switching transistor and the lower electrode of the storage capacitor at the encircled portion 10, and the parasitic capacitance, that is, a gate-drain parasitic capacitance of the transistor is causative of decreasing the signal propagating speed of the transistor and introduces a large time delay in the switching action. The gate electrode within the eaves-like shape of the insulating layer 4 is further causative of reduction in withstand voltage level of the thin dielectric film 2.

If, on the other hand, the gate electrode 7 is spaced from the capacitor electrode 3 in the lateral direction, a part of the gate electrode formed on and around the inter-level insulating layer 4 should be removed in the patterning stage of the polysilicon film 6. Then, a problem is encountered in that the other portion on the gate insulating film 5 is over-etched during the patterning stage of the gate electrode and the surface of the substrate is suffered damage. This is because of the fact that the polysilicon 7a at the step portion is much larger in thickness than the other such as being designated by 7b. Moreover, residual polysilicon tends to be left at the foot of the inter-level insulating layer 4 indicated by the circular broken line 10, and may be causative of an undesirable short circuit.

SUMMARY OF THE INVENTION

It is therefore an important object of the present invention to provide a process of fabricating a dynamic random access memory cell which is free from the problems inherent in the prior art dynamic random access memory cells.

To accomplish these objects, the present invention proposes to previously and partially etching a surface portion of the inter-level structure in an anisotropical manner before patterning the capacitor electrode.

In accordance with the present invention, there is provided a process of fabricating a random access memory cell having a storage capacitor and a switching transistor, comprising the steps of: (a) preparing an oxidizable semiconductor substrate having a capacitor forming portion; (b) forming a dielectric film of the storage capacitor covering at least the capacitor forming portion and a transistor forming area of the oxidizable semiconductor substrate; (c) forming a multiple-level structure having a first oxidizable conductive film on the dielectric film and a first insulating film on the first oxidizable conductive film, the multiple-level structure being provided on the entire structure; (d) providing a first mask layer on the multiple-level structure and located over a capacitor electrode forming area; (e) removing a surface portion of the first insulating film so that a hollow space extends beneath the first mask layer; (f) removing the first insulating film and the first oxidizable conductive film by using the first mask layer, the hollow space causing a declining shoulder portion to take place at an upper edge of the first insulating film; (g) removing the first mask layer; (h) removing the dielectric film from the transistor forming area so that a surface of the oxidizable semiconductor substrate is exposed; (i) oxidizing the first oxidizable conductive film and the oxidizable semiconductor substrate for increasing the thickness of the first insulating film and for forming a second insulating film covering the transistor forming area; (j) depositing a third insulating film on the first and second insulating films; (k) removing a part of the third insulating film and the second insulating film by subjecting an anisotropic etching technique thereto for etching predominately in the vertical direction so that the surface of the oxidizable semiconductor substrate is exposed again, the third insulating film having a declining shoulder portion extending from an upper surface thereof to the surface of the oxidizable semiconductor substrate; (l) growing a gate oxide of the switching transistor on the surface of the oxidizable semiconductor substrate; (m) depositing a second conductive film on the entire surface; and (n) patterning the second conductive film to form a gate electrode of the switching transistor.

BRIEF DESCRIPTION OF THE DRAWINGS

The features and advantages of a process of fabricating a dynamic random access memory cell according to the present invention will be more clearly understood from the following description taken in conjunction with the accompanying drawings in which.

DESCRIPTION OF THE PREFERRED EMBODIMENTS

First Embodiment

Description is made on a process of fabricating a random access memory cell with reference to FIGS. 2A to 2H. The process according to the present invention starts with a lightly doped p-type single crystal silicon substrate 21, and a thick field oxide film (not shown) is formed through a well-known selective oxidation process for defining an active device area. In the active device area, the silicon substrate 21 is selectively doped with n-type impurity atoms, so that a heavily doped impurity region 22 is formed in the silicon substrate 21. The heavily doped n-type impurity region 22 serves as a lower electrode of a storage capacitor at the major portion 22' and as one of the source and drain regions of a switching transistor at the end portion 22".

Figure 1A:
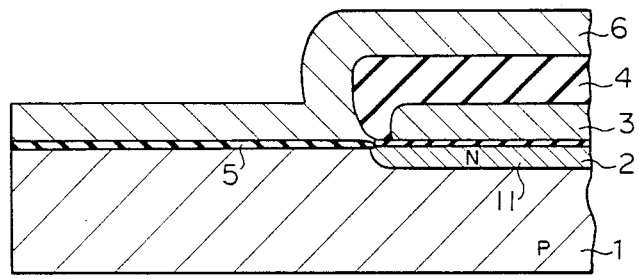
FIGS. 1A and 1B are cross sectional views showing essential stages of the prior art process of fabricating a dynamic random access memory cell.
Figure 1B:
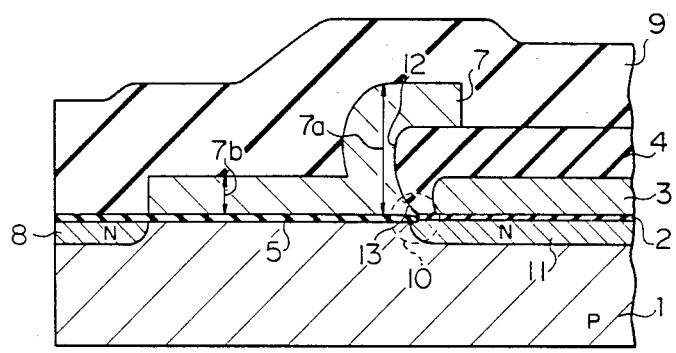
Figure 2A:
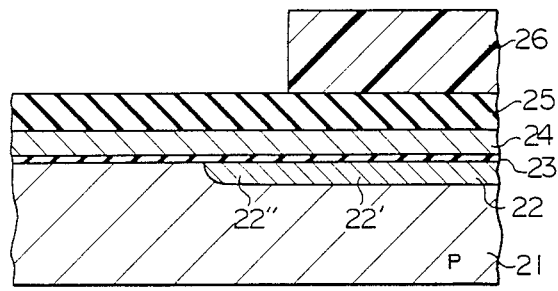
FIGS. 2A to 2H are cross sectional views showing the sequence of a process of fabricating a dynamic random access memory cell according to the present invention.
Figure 3:
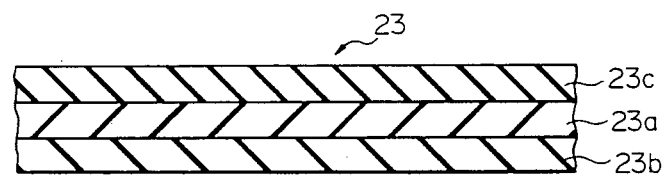
FIG. 3 is a cross sectional view showing the structure of a dielectric film structure of a switching transistor forming a part of the dynamic random access memory cell shown in FIG. 2H.

After the doping stage, a dielectric film structure 23, a phosphorus doped polysilicon film 24 and a silicon oxide film 25 are successively stacked on the active device area of the silicon substrate 21. The dielectric film structure 23 is formed of a silicon nitride 23a sandwiched between silicon oxide films 23b and 23c (see FIG. 3), and the phosphorus doped polysilicon film 24 is deposited to a thickness of about 2000 angstroms to about 3000 angstroms by using, for example, a chemical vapor deposition technique. The silicon oxide film 25 is deposited by using another chemical vapor deposition technique, and the thickness thereof ranges from about 2000 angstroms to about 3000 angstroms. A photoresist solution is spun onto an entire surface of the structure for formation of a photoresist film, and the photoresist film is patterned through lithographic techniques, thereby being formed into a mask layer 26. The resultant structure of this stage is shown in FIG. 2A.

Figure 2B:
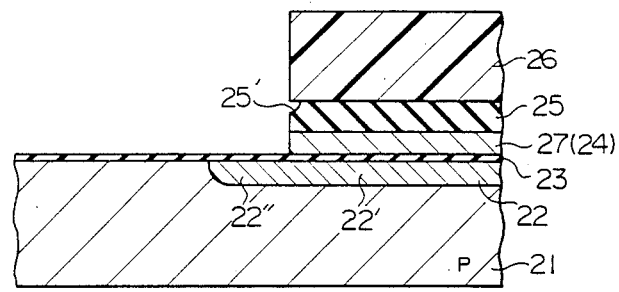

Using the mask layer 26, the surface portion of the silicon oxide film 25 is isotropically etched away, and a bias takes place in the silicon oxide film 25 due to the equal etching rates between the vertical and lateral directions. The etching profile beneath the mask layer 26 appears as a generally quarter-circle to form a hollow space 25'. In this instance, a buffered fluoric acid is used as the isotropic etchant. The isotropic etching stage is followed by anisotropic dry etching stages, and the silicon oxide film 25 and, then, the phosphorus doped polysilicon film 24 are successively removed for defining an upper capacitor electrode 27. The left edge of the upper capacitor electrode 27 is aligned with the mask layer 26 as shown in FIG. 2B, and this configuration is conducive to forming a mild slope of an inter-level insulating layer.

Figure 2C:
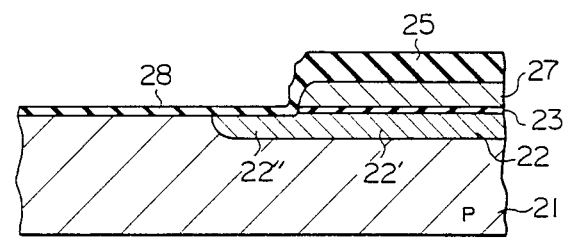

The mask layer 26 is stripped off, and the exposed portion of the dielectric film structure 23 is etched away. The silicon substrate 21 is placed in an oxidation ambient at about 900 degrees to about 950 degrees in centigrade for about 5 minutes to about 10 minutes, so that a silicon oxide film 28 is grown on the silicon substrate 21 and the silicon oxide film 25 is increased in thickness. Since the polysilicon doped with the phosphorus atoms promotes the oxidation, the silicon oxide film 25 is rapidly grown, but the silicon oxide film 28 is slowly grown so as to be relatively thin. The etching profile of the silicon oxide film 25 is upwardly transferred, and, for this reason, the left side of the upper portion thereof still appears as a generally quarter-circle. The resultant structure of this stage is shown in FIG. 2C.

Figure 2D:
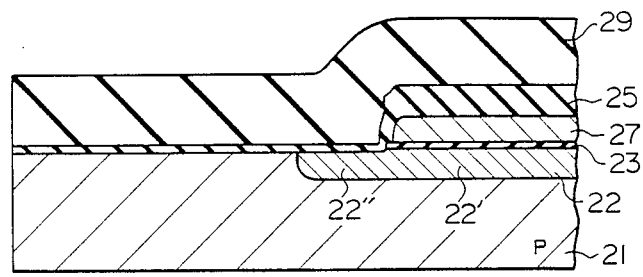

A silicon oxide film 29 is deposited by using the chemical vapor deposition technique, and is as thick as or greater than the total thickness of the silicon oxide film 25 and the capacitor electrode 27. In this instance, the silicon oxide film 29 ranges from about 4000 angstroms to about 6000 angstroms. The resultant structure of this stage is shown in FIG. 2D.

Figure 2E:
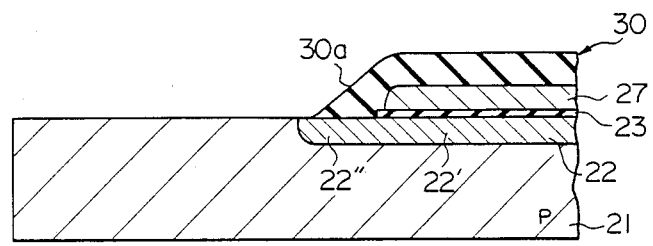

The silicon oxide film 29 is uniformly removed in the vertical direction by using anisotropic etch-back technique, that is, a directional reactive ion etching for removing the film 29 predominately in the vertical direction until the fresh surface of the silicon substrate 21 is exposed. Since the silicon oxide film 25 has the left side of the upper portion shaped into the generally quarter-circle and the anisotropical etch-back is subjected to the film 29, the silicon oxide film covering the capacitor electrode 27 has a mild or non-steep shoulder portion 30a as shown in FIG. 2E, and serves as an inter-level insulating film 30. The exposed surface of the silicon substrate 21 is subjected to bombardment with the etchant and, for this reason, is liable to be damaged. However, if the exposed surface portion is slightly etched away by using a liquid etchant, a fresh surface without any damage is exposed again, and the contaminant is also removed from the silicon substrate 21.

Figure 2F:
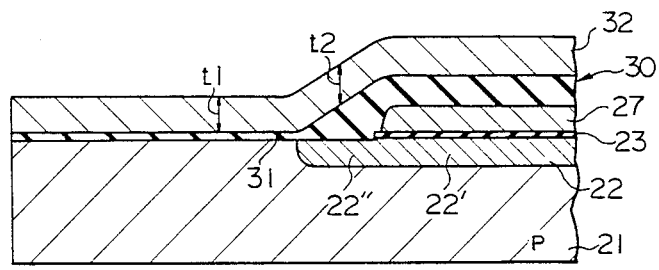

The silicon substrate 21 is placed in an oxidation ambient, and a thin gate oxide film 31 is thermally grown on the exposed surface of the silicon substrate 21. Subsequently, a polysilicon film 32 is deposited on the entire surface of the structure. Since the inter-level insulating film 30 has the mild shoulder 30a, the polysilicon film 32 is generally uniform in thickness, and, for this reason, the thickness t1 on the bottom portion is nearly equal to the thickness t2 on the shoulder portion 30a. The resultant structure of this stage is shown in FIG. 2F.

Figure 2G:
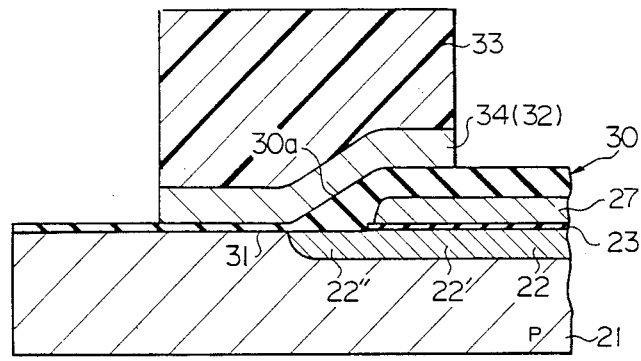

A photoresist solution is spun onto the entire structure, and the photoresist film is patterned to form a mask layer 33. Using the mask layer 33, the polysilicon film 32 is etched and patterned through the lithographic process, so that a gate electrode 34 is formed from the polysilicon film 32 as shown in FIG. 2G. Since the shoulder portion 30a of the inter-level insulating film 30 is mild in the decline, no disconnection takes place in the gate electrode 34. Moreover, the mild decline allows the inter-level insulating film 30 to be thick enough to decrease the parasitic capacitance produced thereacross. This results in improvement in switching speed.

Figure 2H:
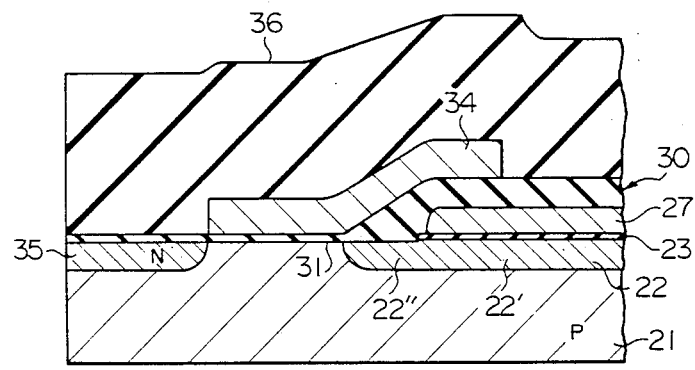

After the formation of the gate electrode 34, the photo-mask layer 33 is stripped off, and n-type impurity atoms are doped into the silicon substrate 21. In this stage, the gate electrode 34 serves as the doping mask. The n-type impurity region 35 thus produced serves as the other of the source and drain regions of the switching transistor contiguous to a bit line, and the gate oxide film 31 and the gate electrode 34 as a whole constitute a gate structure of a switching transistor. The switching transistor selectively provides a channel between the source and drain regions 35 and 22″, and a data bit in the form of electric charges is memorized into or read out from the storage capacitor. When the memory cell constituted by the storage capacitor and the switching transistor is fabricated on the silicon substrate 21, an upper insulating film 36 is deposited on the entire surface of the structure as shown in FIG. 2H. In this instance, the storage capacitor has the m+ type lower capacitor electrode 22′, so that the storage capacitor can accumulate electric charges with a relatively low or the ground voltage level (which is approximately equal to the biasing voltage level of the substrate 21) applied to the capacitor electrode 27. However, no n+ type region may be formed as the lower capacitor electrode, and a positive voltage level may be applied to the capacitor electrode for formation of an inversion layer which serves as the lower capacitor electrode.

Second Embodiment

Turning to FIGS. 4A to 4I, another process sequence is described, and the present invention is applied to a process of fabricating a trench type random access memory cell.

Figure 4A:
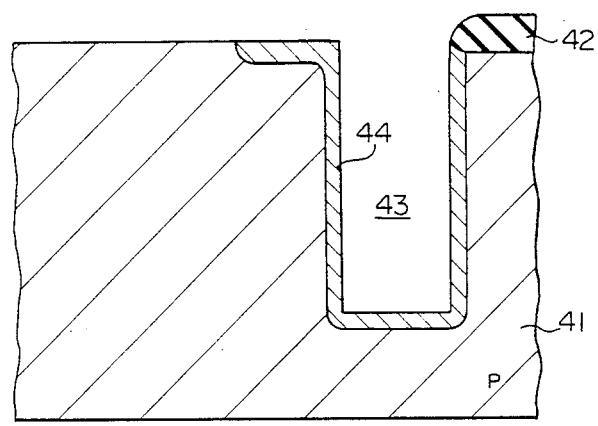
FIG. 4A to 4I are cross sectional views showing the sequence of another process of fabricating a dynamic random access memory cell according to the present invention.

The process starts with a single crystal silicon substrate 41 lightly doped with p-type impurity atoms, and a thick field oxide film 42 is, then, grown on the silicon substrate 41. An anisotropical etching technique such as, for example, a reactive ion etching technique is carried out for formation of a trench 43 defined by a wall portion. Impurity atoms of an n-type are doped into the wall portion, so that an n+ type impurity region 44 consisting of one of the source and drain regions 44″ of a switching transistor along the major surface portion of the substrate 41 and a lower electrode 44′ of a storage capacitor along the wall portion is formed. The resultant structure of this stage is shown in FIG. 4A.

Figure 4B:
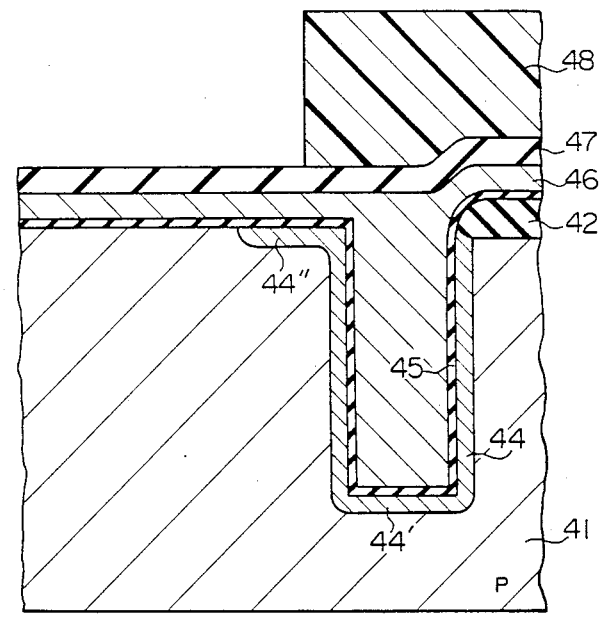

Subsequently, a thin oxide film is thermally grown on the entire surface, and a silicon nitride film and a silicon oxide film are successively deposited to form a triple level structure 45, so that the triple level structure 45 consists of the silicon nitride film sandwiched between the two silicon oxide films. This structure improves a resistivity against undesirable breaking down phenomenon at the corner edge of the trench. A doped polysilicon 46 is deposited on the entire surface, and the trench 43 is filled with the doped polysilicon 46. The doped polysilicon 46 further extends over the triple level structure 45. On the entire surface of the structure is deposited a silicon oxide film 47 onto which a photoresist solution is spun for forming a photo-resist film. The photo-resist film is patterned to provide a mask layer 48 which covers an upper capacitor electrode forming area. The resultant structure of this stage is shown in FIG. 4B.

Figure 4C:
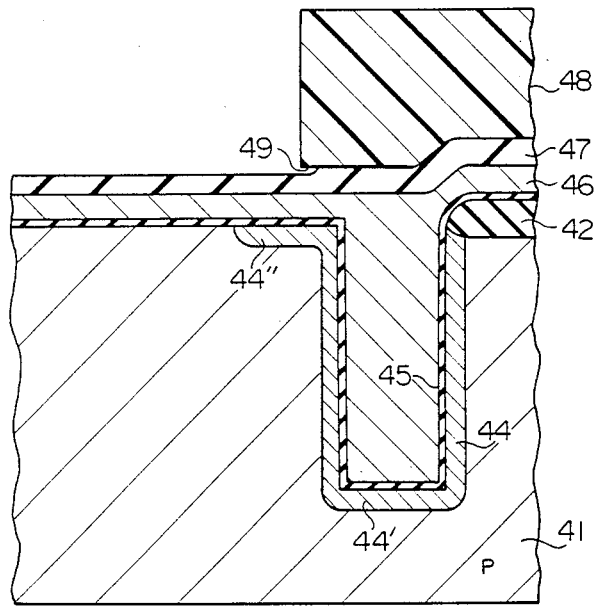

The silicon oxide film 47 is slightly etched away by using a buffered fluoric acid as an etchant, so that a hollow space 49 is formed in the surface portion of the silicon oxide film 47, and the hollow space 49 extends beneath the photo-mask 48 as shown in FIG. 4C.

Figure 4D:
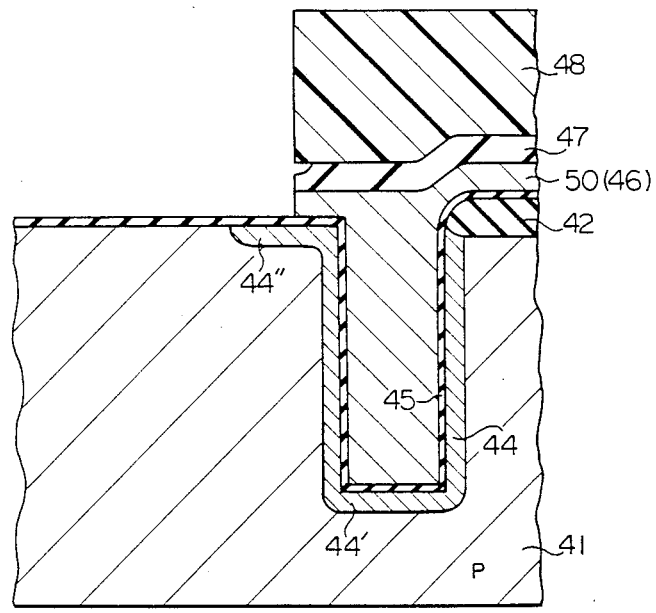

Subsequently, anisotropical etching stages are applied to the silicon oxide film 47 and the doped polysilicon 46, and the same mask layer 48 is used for the anisotropical etching stages. In the silicon oxide film 47 thus patterned a generally quarter-circle hollow space is left, but the left side edge of a capacitor electrode 50 is substantially aligned with the left side edge of the mask layer 48 as shown in FIG. 4D.

Figure 4E:
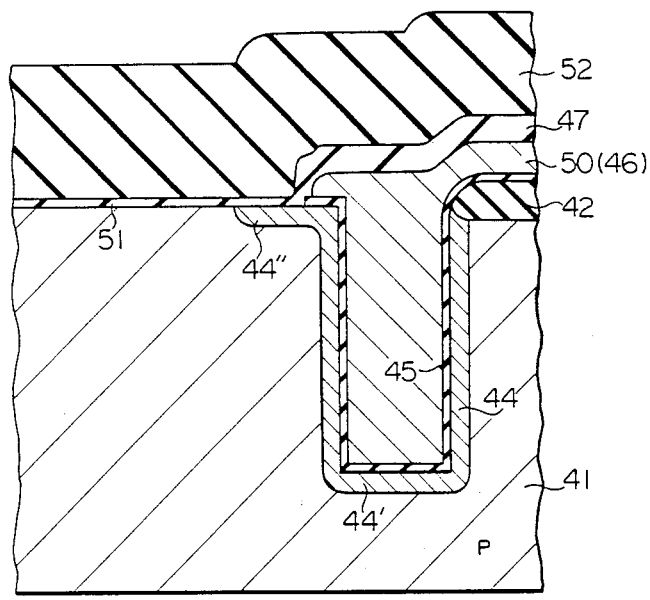
Figure 4F:
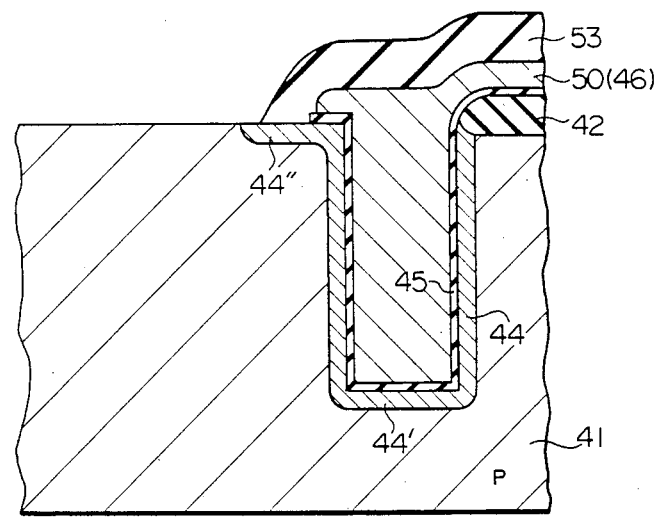

The exposed triple level structure 45 is partially removed from the upper surface of the silicon substrate 41, and the substrate is placed in an oxidizing ambient. As a result, a thin silicon oxide film 51 covers the exposed upper surface of the silicon substrate 41, and the silicon oxide film 47 is increased in the thickness due to the oxidation of the doped polysilicon 46. A silicon oxide film 52 is then deposited on the entire surface of the structure to a thickness equal to or greater than the total thickness of the silicon oxide film 47 and the doped polysilicon 46 as shown in FIG. 4E.

An etch-back technique (which is described in the previous embodiment) is applied to the silicon oxide film 52 until the upper surface of the silicon substrate 41 is exposed. Since the silicon oxide film 47 has a mild shoulder portion at the left upper edge thereof, the silicon oxide film 52, which is merged with the silicon oxide film 47, smoothly extends toward the upper surface of the silicon substrate 41 as will be seen from FIG. 4F. The residual silicon oxide films 47 and 52 serves as an inter-level insulating film 53.

Figure 4G:
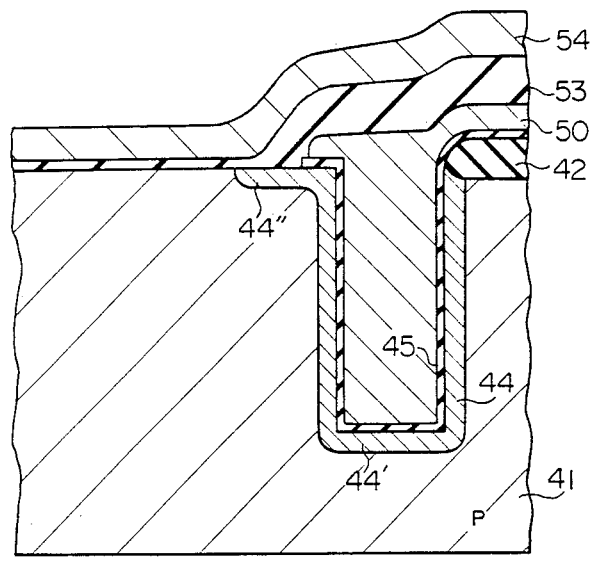
Figure 4H:
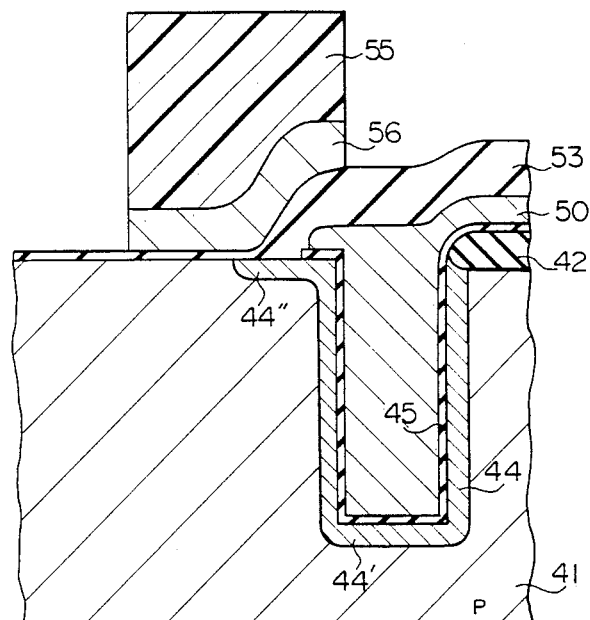

A polysilicon film 54 is then deposited over the entire surface of the structure, and is smoothly declined by virtue of the smoothly declining surface of the inter-level insulating film 53 as shown in FIG. 4G.

A photoresist solution is spun onto the entire surface, and is patterned through the lithographic techniques so that a mask layer 55 is formed on the polysilicon film 54. Using the mask layer 55, the polysilicon film 54 is patterned to form a gate electrode 56 of a switching transistor (see FIG. 4H), and, thereafter, the mask layer 55 is stripped off.

Figure 4I:
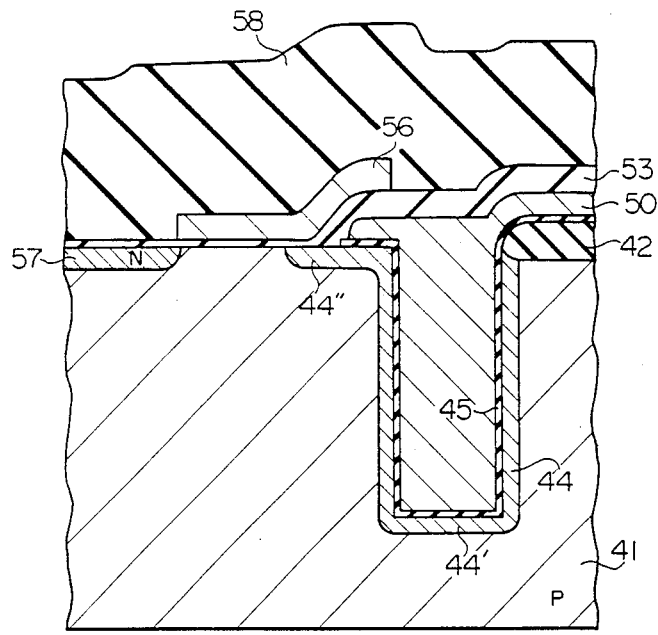

Using the gate electrode 56 as a mask, n-type impurity atoms are selectively doped into a transistor forming area, and, for this reason, a source/drain region 57 contiguous to a bit line is formed in a self-align manner. Finally, an insulating film 58 is deposited over the entire surface of the structure, and the dynamic random access memory cell is completed as shown in FIG. 4I.

Although particular embodiments of the present invention have been shown and described, it will be obvious to those skilled in the art that various changes and modifications may be made without departing from the spirit and scope of the present invention.

What is claimed is:

1. A process of fabricating a random access memory cell having a storage capacitor and a switching transistor, comprising the steps of:
   (a) preparing an oxidizable semiconductor substrate having a capacitor forming portion;
   (b) forming a dielectric film of said storage capacitor covering at least said capacitor forming portion and a transistor forming area of said oxidizable semiconductor substrate;
   (c) forming a multiple-level structure having a first oxidizable conductive film on said dielectric film and a first insulating film on the first oxidizable conductive film, said multiple-level structure being provided on the entire structure;
   (d) providing a first mask layer on said multiple-level structure and located over a capacitor electrode forming area;
   (e) removing a surface portion of said first insulating film so that a hollow space extends beneath said first mask layer;
   (f) removing said first insulating film and said first oxidizable conductive film by using said first mask layer, said hollow space causing a declining shoulder portion to take place at an upper edge of said first insulating film;
   (g) removing said first mask layer;
   (h) removing said dielectric film from said transistor forming area so that a surface of said oxidizable semiconductor substrate is exposed;
   (i) oxidizing said first oxidizable conductive film and said oxidizable semiconductor substrate for increasing the thickness of said first insulating film and for forming a second insulating film covering said transistor forming area;
   (j) depositing a third insulating film on said first and second insulating films;
   (k) removing a part of said third insulating film and said second insulating film by subjecting an anisotropic etching technique thereto for etching predominately in the vertical direction so that the surface of said oxidizable semiconductor substrate is exposed again, said third insulating film having a declining shoulder portion extending from an upper surface thereof to the surface of said oxidizable semiconductor substrate;
   (l) growing a gate oxide of said switching transistor on the surface of said oxidizable semiconductor substrate;
   (m) depositing a second conductive film on the entire surface; and
   (n) patterning said second conductive film to form a gate electrode of said switching transistor.

2. A process of fabricating a dynamic random access memory cell as set forth in claim 1, in which said oxidizable semiconductor substrate is formed of silicon.

3. A process of fabricating a dynamic random access memory cell as set forth in claim 2, in which said capacitor forming portion occupies a flat surface portion of said oxidizable semiconductor substrate.

4. A process of fabricating a dynamic random access memory cell as set forth in claim 3, in which a lower electrode is formed in said capacitor forming portion.

5. A process of fabricating a dynamic random access memory cell as set forth in claim 4, in which said dielectric film is formed by a silicon nitride sandwiched between silicon oxide films.

6. A process of fabricating a dynamic random access memory cell as set forth in claim 5, in which conductive film is formed by a doped polysilicon.

7. A process of fabricating a dynamic random access memory cell as set forth in claim 6, in which said first insulating film is formed by a silicon oxide.

8. A process of fabricating a dynamic random access memory cell as set forth in claim 7, in which said step (e) is a achieved by using an isotropical etching technique so as to form said hollow space.

9. A process of fabricating a dynamic random access memory cell as set forth in claim 8, in which said step (f) is achieved by using an anisotropical etching technique.

10. A process of fabricating a dynamic random access memory cell as set forth in claim 8, in which said isotropical etching is carried out by using an etchant of a buffered fluoric acid.

11. A process of fabricating a dynamic random access memory cell as set forth in claim 10, in which said third insulating film is formed of a silicon oxide.

12. A process of fabricating a dynamic random access memory cell as set forth in claim 11, in which said second conductive film is formed of a polysilicon.

13. A process of fabricating a dynamic random access memory cell as set forth in claim 12, in which said process further comprises the steps of (o) selectively doping impurity atoms into the surface of said oxidizable semiconductor substrate so as to form a source of said switching transistor; and (p) covering the entire surface with a fourth insulating film.

14. A process of fabricating a dynamic random access memory cell as set forth in claim 1, in which said step (a) comprises sub-steps of (a-1) forming a trench in said oxidizable semiconductor substrate, said trench being defined by a wall portion of said oxidizable semiconductor substrate, and (a-2) doping said wall portion with impurity atoms.

15. A process of fabricating a dynamic random access memory cell as set forth in claim 14, in which said dielectric film comprises a triple level structure having a nitride film sandwiched between oxide films.

16. A process of fabricating a dynamic random access memory cell as set forth in claim 15, in which said oxidizable semiconductor substrate is formed of a silicon.

17. A process of fabricating a dynamic random access memory cell as set forth in claim 16, in which said nitride film is of a silicon nitride, and in which said oxide films are of a silicon oxide.

18. A process of fabricating a dynamic random access memory cell as set forth in claim 13, in which said gate electrode of said switching transistor is partially overlapped with the remaining portion of said oxidizable first conductive film.

19. A process of fabricating a dynamic random access memory cell as set forth in claim 17, in which said gate electrode of said switching transistor is partially overlapped with the remaining portion of said oxidizable first conductive film.

* * * * *